(12) United States Patent
Chin et al.

(10) Patent No.: US 8,586,442 B2
(45) Date of Patent: Nov. 19, 2013

(54) MANUFACTURING METHOD FOR HIGH VOLTAGE TRANSISTOR

(71) Applicant: Macronix International Co., Ltd., Hsinchu (TW)

(72) Inventors: Yu-Hsien Chin, Taipei (TW); Chih-Chia Hsu, Zhongli (TW); Yin-Fu Huang, Tainan (TW)

(73) Assignee: Macronix International Co. Ltd., Hsinchu (TW)

( * ) Notice: Subject to any disclaimer, the term of this patent is extended or adjusted under 35 U.S.C. 154(b) by 0 days.

(21) Appl. No.: 13/687,523

(22) Filed: Nov. 28, 2012

(65) Prior Publication Data

US 2013/0089960 A1     Apr. 11, 2013

Related U.S. Application Data

(62) Division of application No. 13/041,752, filed on Mar. 7, 2011, now Pat. No. 8,367,511.

(51) Int. Cl.
*H01L 21/331*        (2006.01)

(52) U.S. Cl.
USPC .............. 438/369; 438/289; 257/E21.382

(58) Field of Classification Search
USPC ......... 438/174, 175, 186, 194, 235, 236, 316, 438/369; 257/E21.177, E21.188, E21.37, 257/E21.608
See application file for complete search history.

(56) References Cited

U.S. PATENT DOCUMENTS

| | | |
|---|---|---|
| 2005/0118753 A1 | 6/2005 | Efland et al. |
| 2005/0285198 A1 | 12/2005 | Chang et al. |
| 2007/0141794 A1 | 6/2007 | Morris |
| 2008/0090347 A1 | 4/2008 | Huang et al. |

*Primary Examiner* — Cheung Lee
(74) *Attorney, Agent, or Firm* — McClure, Qualey & Rodack, LLP

(57) ABSTRACT

A manufacturing method for a high voltage transistor includes the following steps. A substrate is provided. A P-type epitaxial (P-epi) layer is provided above the substrate. An N-well is formed in the P-epi layer. A P-well is formed in the P-epi layer. Field oxide (FOX) layers are formed above the P-epi layer. A gate oxide (GOX) layer is formed between the FOX layers. P-type implants are doped into the P-well or N-type implants are doped into the N-well to adjust an electrical function of the high voltage transistor.

9 Claims, 8 Drawing Sheets

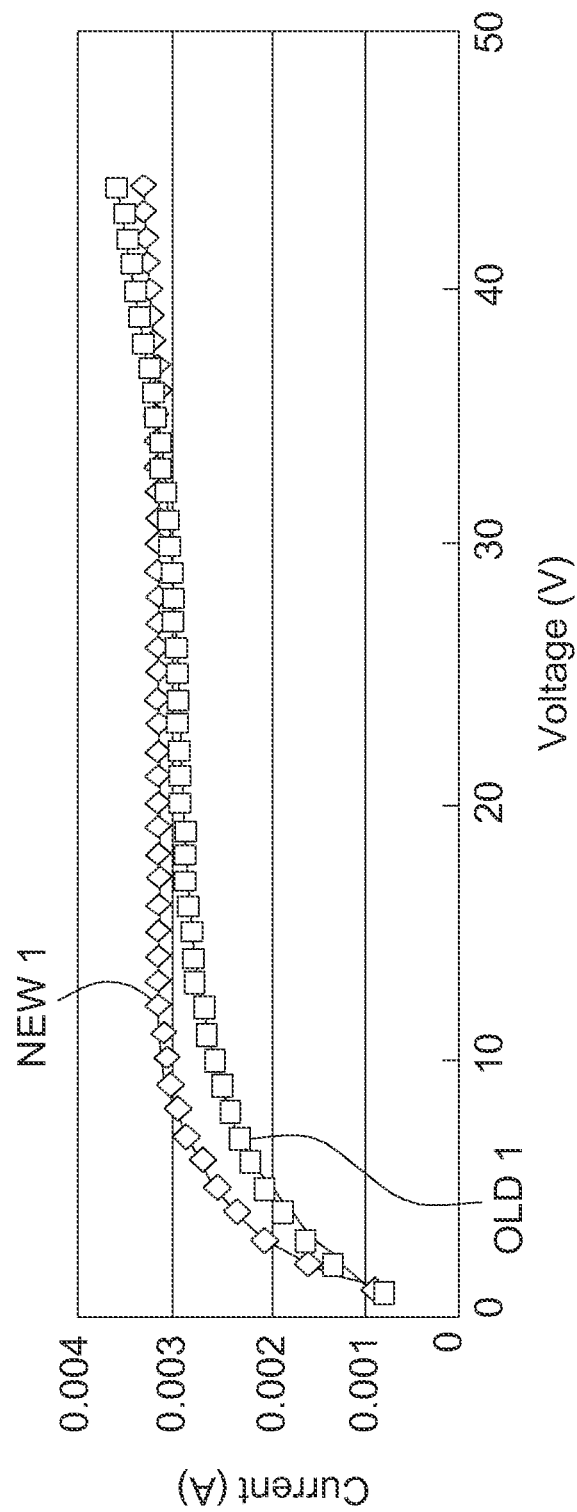

MANUFACTURING METHOD FOR HIGH VOLTAGE TRANSISTOR

CROSS REFERENCE TO RELATED APPLICATIONS

This application is a divisional application of U.S. patent application Ser. No. 13/041,752, filed Mar. 7, 2011 and entitled "MANUFACTURING METHOD FOR HIGH VOLTAGE TRANSISTOR", now U.S. Pat. No. 8,367,511, the contents of which are incorporated herein by reference.

BACKGROUND OF THE INVENTION

1. Field of the Invention

The invention relates in general to a manufacturing method for a transistor, and more particularly to a manufacturing method for a high voltage transistor.

2. Description of the Related Art

With the development of the semiconductor technology, a high voltage transistor has been developed. A deep well doped with ions is formed on a substrate, and the high voltage transistor is disposed in the deep well to obtain the higher reference withstanding voltage (also referred to as a breakdown voltage).

In many applications, designers have to increase the breakdown voltage of the high voltage transistor through various manufacturing processes. However, it is not easy to increase the breakdown voltage of the high voltage transistor. Under various factors, the stable results of the substrate current (Isub) and the specific turn-on resistance (Ronsp) of the high voltage transistor cannot be obtained.

In addition, the high voltage transistor also often encounters the problem of Kirk's effect. Kirk's effect represents that the cut-off frequency descends while the drain current of the transistor ascends. Since a lot of carriers are injected, the width of the depletion layer on the junction of the drain and the source is decreased, and the dummy increase of the source width is caused.

The above-mentioned phenomena are the great bottlenecks encountered in the current high voltage transistor technology. Thus, it is an important target in the current semiconductor industry to develop the new technology to improve the above-mentioned phenomena.

SUMMARY OF THE INVENTION

The invention is directed to a manufacturing method for a high voltage transistor having the design of the step of doping P-type implants into a P-well or doping N-type implants into an N-well, so that the doping result may be kept stable to further improve the unstable phenomena of the substrate current (Isub) and the specific turn-on resistance (Ronsp) as well as Kirk's effect. In addition, a mask may be shared to decrease the manufacturing cost significantly.

According to a first aspect of the present invention, a manufacturing method for a high voltage transistor is provided. The method includes the following steps. A substrate is provided. A P-type epitaxial (P-epi) layer is provided above the substrate. An N-well is formed in the P-epi layer. A P-well is formed in the P-epi layer. A plurality of field oxide (FOX) layers is formed above the P-epi layer. A gate oxide (GOX) layer is formed between the FOX layers. P-type implants are doped into the P-well to adjust an electrical function of the high voltage transistor.

According to a second aspect of the present invention, a manufacturing method for a high voltage transistor is provided. The method includes the following steps. A substrate is provided. A P-epi layer is provided above the substrate. An N-well is formed in the P-epi layer. A P-well is formed in the P-epi layer. A plurality of field oxide (FOX) layers is formed above the P-epi layer. A gate oxide (GOX) layer is formed between the FOX layers. N-type implants are doped into the N-well to adjust an electrical function of the high voltage transistor.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 3 is a plot showing a specific turn-on resistance (Ronsp) of the N-type high voltage transistor according to the first embodiment of the invention.

DETAILED DESCRIPTION OF THE INVENTION

Figure 1A:
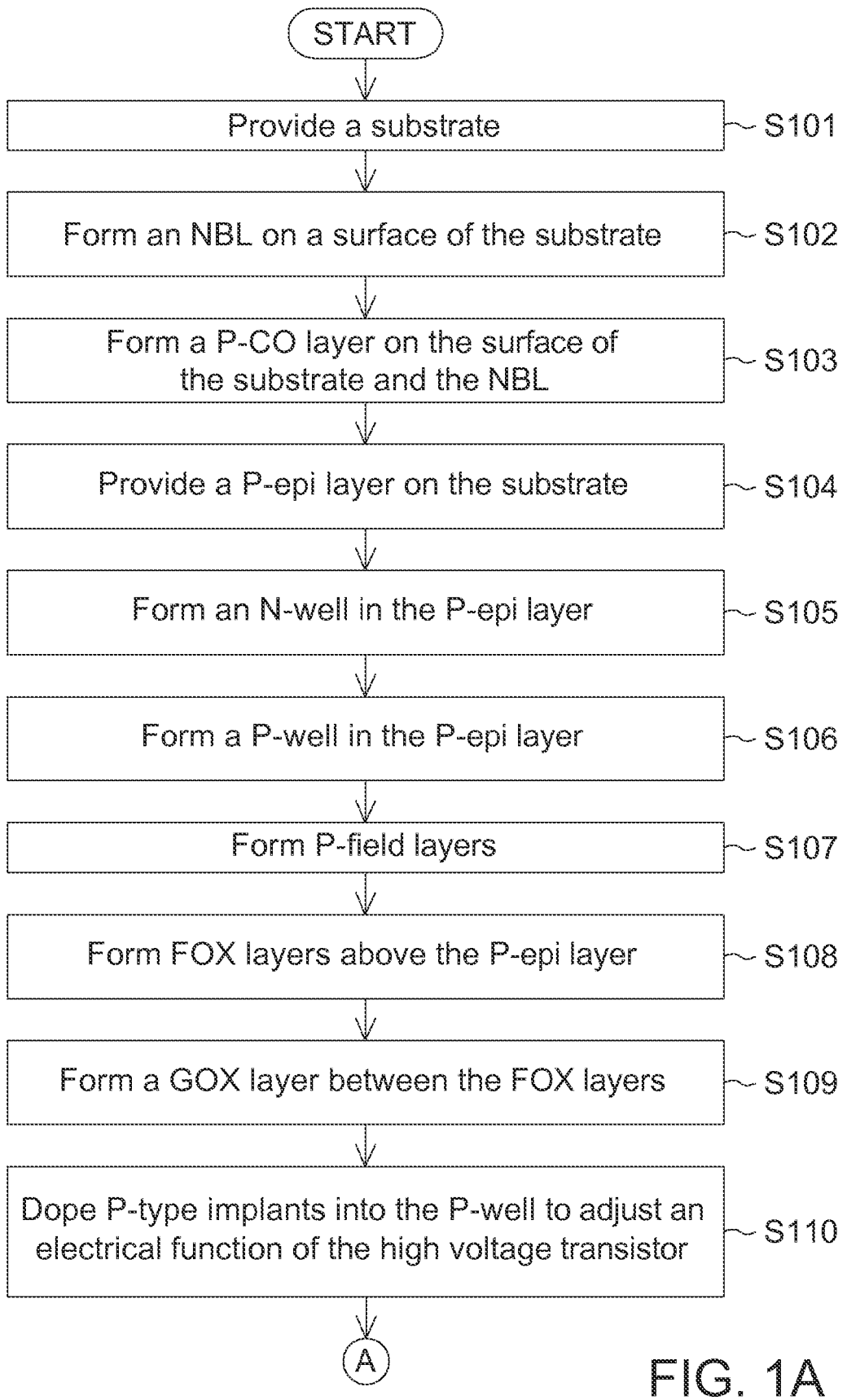
FIGS. 1A and 1B are flow charts showing a manufacturing method for an N-type high voltage transistor according to a first embodiment of the invention.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "upper", "lower", "left", "right", "up", "down", "above", "below", "top", "bottom", "front" and "rear" should be construed to refer to the orientation as then described or as shown in the drawing under discussion. These relative terms are for convenience of description only and do not require that the apparatus be constructed or operated in a particular orientation unless explicitly indicated as such. The invention may be implemented in conjunction with various integrated circuit manufacturing processes and other techniques. In order to provide the understanding to the invention, only some manufacturing steps are included. The invention typically has the applicability to the fields of the semiconductor device and manufacturing processes. However, for the purpose of illustration, the following descriptions relate to the manufacturing method of the high voltage transistor.

In addition, the embodiments are only illustrated as examples and do not intend to restrict the scope and claim of the invention. Furthermore, unessential elements are omitted from the drawings of the embodiments so that the technological features of the invention can be clearly seen.

In the following embodiments, the doping result can be kept stable according to the design of the step of doping P-type implants into a P-well or doping N-type implants into an N-well. The unstable phenomena of the substrate current (Isub) and the specific turn-on resistance (Ronsp) can be further improved, and the Kirk's effect can be improved. In addition, the design of sharing a mask can greatly decrease the manufacturing cost.

In the first embodiment to be illustrated, the N-type high voltage transistor adopts the design of doping the P-type implants into the P-well. In the second embodiment to be illustrated, the P-type high voltage transistor adopts the design of doping the P-type implants into the P-well. However, the first embodiment and the second embodiment may also adopt the design of doping the N-type implants into the N-well.

First Embodiment

Figure 1B:
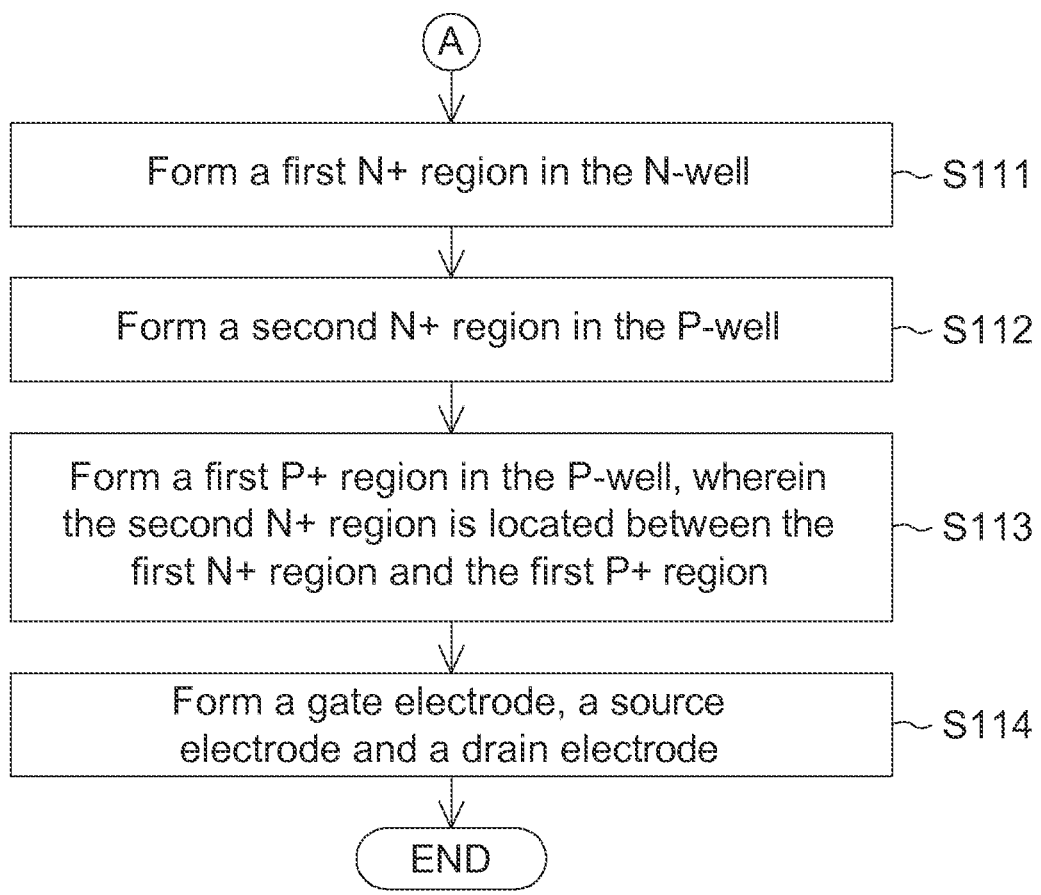
Figure 2A:
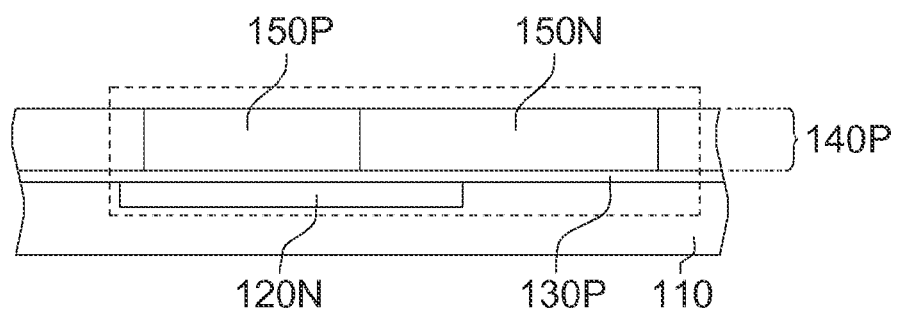
FIGS. 2A to 2C are schematic illustrations showing structures in various steps of FIGS. 1A and 1B.
Figure 2B:
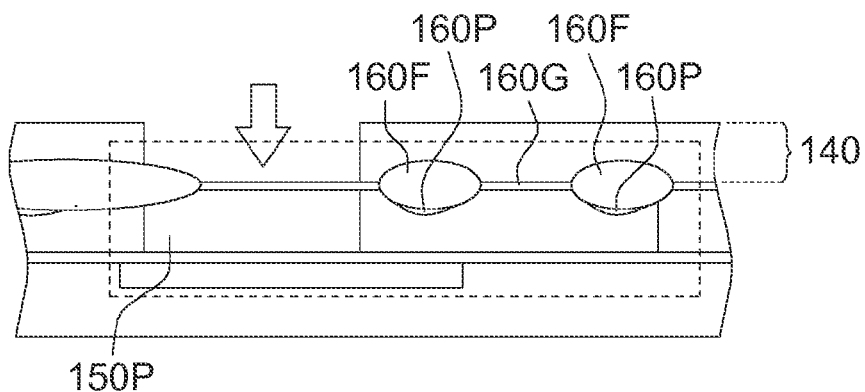
Figure 2C:
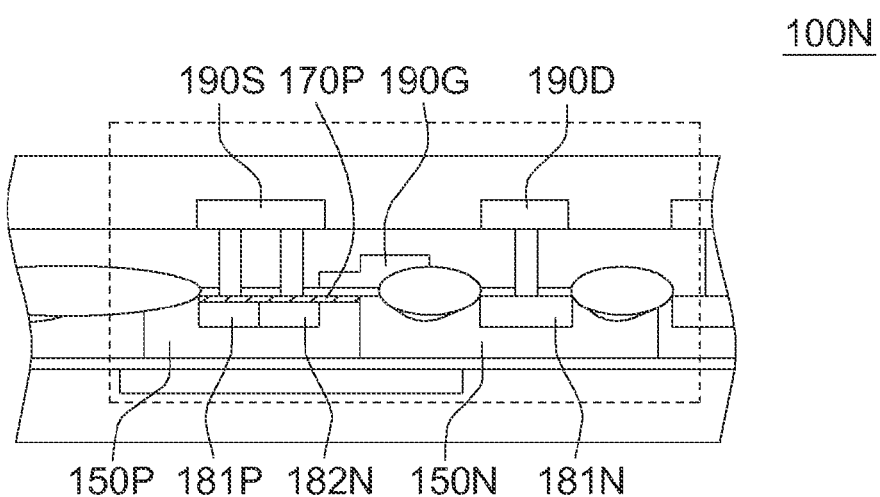

Please refer to FIGS. 1A and 1B and FIGS. 2A to 2C. FIGS. 1A and 1B are flow charts showing a manufacturing method for an N-type high voltage transistor 100N according to the first embodiment of the invention. FIGS. 2A to 2C are schematic illustrations showing structures in various steps of FIGS. 1A and 1B.

First, in step S101, as shown in FIG. 2A, a substrate 110 is provided. The substrate 110 is, for example but without limitation, a P-type substrate.

Next, in step S102, as shown in FIG. 2A, an N-buried layer (NBL) 120N is formed on a surface of the substrate 110. The disposed position of the NBL 120N is determined according to a P-well 150P to be formed in the following step. In general, the disposed range of the NBL 120N exceeds the range of the predetermined position of the P-well 150P. The NBL 120N can provide the good insulation property between the P-well 150P and the following P-type epitaxial (P-epi) layer 140P. In one embodiment, the step of forming the NBL 120N may also be omitted or replaced with another manufacturing process.

Then, in step S103, as shown in FIG. 2A, a P-CO layer 130P is formed on the surface of the substrate 110 and the NBL 120N. In one embodiment, the step of forming the P-CO layer 130P may also be omitted or replaced with another manufacturing process.

Next, in step S104, as shown in FIG. 2A, a P-epi layer 140P is provided on the substrate 110.

Then, in step S105, as shown in FIG. 2A, an N-well 150N is formed in the P-epi layer 140P. In this step, a specific mask is utilized to perform an exposure development process, and then a patterned resist layer is formed, and an ion implantation process is performed to form the N-well 150N.

Next, in step S106, as shown in FIG. 2A, the P-well 150P is formed in the P-epi layer 140P. In this step, a specific mask is utilized to perform the exposure development process, and then a patterned resist layer is formed and an ion implantation process is performed to form the P-well 150P.

As shown in FIG. 2A, the NBL 120N is disposed below the P-well 150P to provide the good insulation property for the P-well 150P.

Next, in step S107, as shown in FIG. 2B, several P-field layers 160P are formed. The P-field layers 160P are formed at predetermined positions where FOX layers 160F are to be formed. In one embodiment, the step of forming the P-field layers 160P may also be omitted or replaced with another manufacturing process.

Then, in step S108, as shown in FIG. 2B, several field oxide (FOX) layers 160F are formed on the P-epi layer 140P. In this step, the FOX layers 160F are formed by a thermal process.

Next, in step S109, as shown in FIG. 2B, a gate oxide (GOX) layer 160G is formed between the FOX layers 160F. In this step, a thermal process is performed to form the GOX layer 160G. In one embodiment, the GOX layer 160G may only be formed between the FOX layers 160F. In another embodiment, the GOX layer 160G may be formed on the entire of the surface of those layers.

Then, in step S110, as shown in FIGS. 2B and 2C, the P-type implants 170P are doped into the P-well 150P to adjust an electrical function of a high voltage transistor 100N. In this step, a specific mask is utilized to perform the exposure development process, and then a patterned resist layer is formed, and the process of doping the P-type implants 170P is performed. In one embodiment, the same mask may be adopted in the step S110 of doping the P-type implants 170P into the P-well 150P and the step S106 of forming the P-well 150P. Consequently, no extra expensive mask cost has to be added, and the manufacturing cost is greatly decreased.

In addition, the step S110 of doping the P-type implants 170P into the P-well 150P is performed after the step S108 of forming the FOX layers 160F and the step S109 of forming the GOX layer 160G. Consequently, it is possible to prevent the thermal processes performed in the step S108 of forming the FOX layers 160F and the step S109 of forming the GOX layer 160G from affecting the doping result of the P-type implants 170P.

In one embodiment, this step may also alternatively adopt the method of doping the N-type implants (not shown) into the N-well 150N to adjust the electrical function of the high voltage transistor 100N.

Next, in step S111, as shown in FIG. 2C, a first N+ region 181N is formed in the N-well 150N.

Then, in step S112, as shown in FIG. 2C, a second N+ region 182N is formed in the P-well 150P.

Next, in step S113, as shown in FIG. 2C, a first P+ region 181P is formed in the P-well 150N, wherein the second N+ region 182N is located between the first N+ region 181N and the first P+ region 181P.

Then, in step S114, as shown in FIG. 2C, a gate electrode 190G, a source electrode 190S and a drain electrode 190D are formed. The gate electrode 190G is located between the source electrode 190S and the drain electrode 190D. The source electrode 190S is electrically connected to the second N+ region 182N and the first P+ region 181P, and the drain electrode 190D is electrically connected to the first N+ region 181N.

Consequently, the N-type high voltage transistor 100N of this embodiment is completed. In the N-type high voltage transistor 100N of this embodiment, the step S110 of doping the P-type implants 170P into the P-well 150P is arranged after the step S108 of forming the FOX layers 160F and the step S109 of forming the GOX layer 160G, so that the doping result of the P-type implants 170P can be kept stable. FIG. 3 is a plot showing a specific turn-on resistance (Ronsp) of the N-type high voltage transistor 100N according to the first embodiment of the invention. As shown on the left side of FIG. 3, it is found that the plot NEW1 of this embodiment is improved as compared with the conventional plot OLD1 in the unstable phenomena of the substrate current (Isub) and the specific turn-on resistance (Ronsp). As shown on the right side of FIG. 3, it is found that the plot NEW1 of this embodiment is improved as compared with the conventional plot OLD1 in the Kirk's effect.

In addition, because the same mask is adopted in the step S110 of doping the P-type implants 170P into the P-well 150P and the step S106 of forming the P-well 150P, no extra expensive mask cost has to be added, and the manufacturing cost is greatly decreased.

Second Embodiment

Figure 4A:
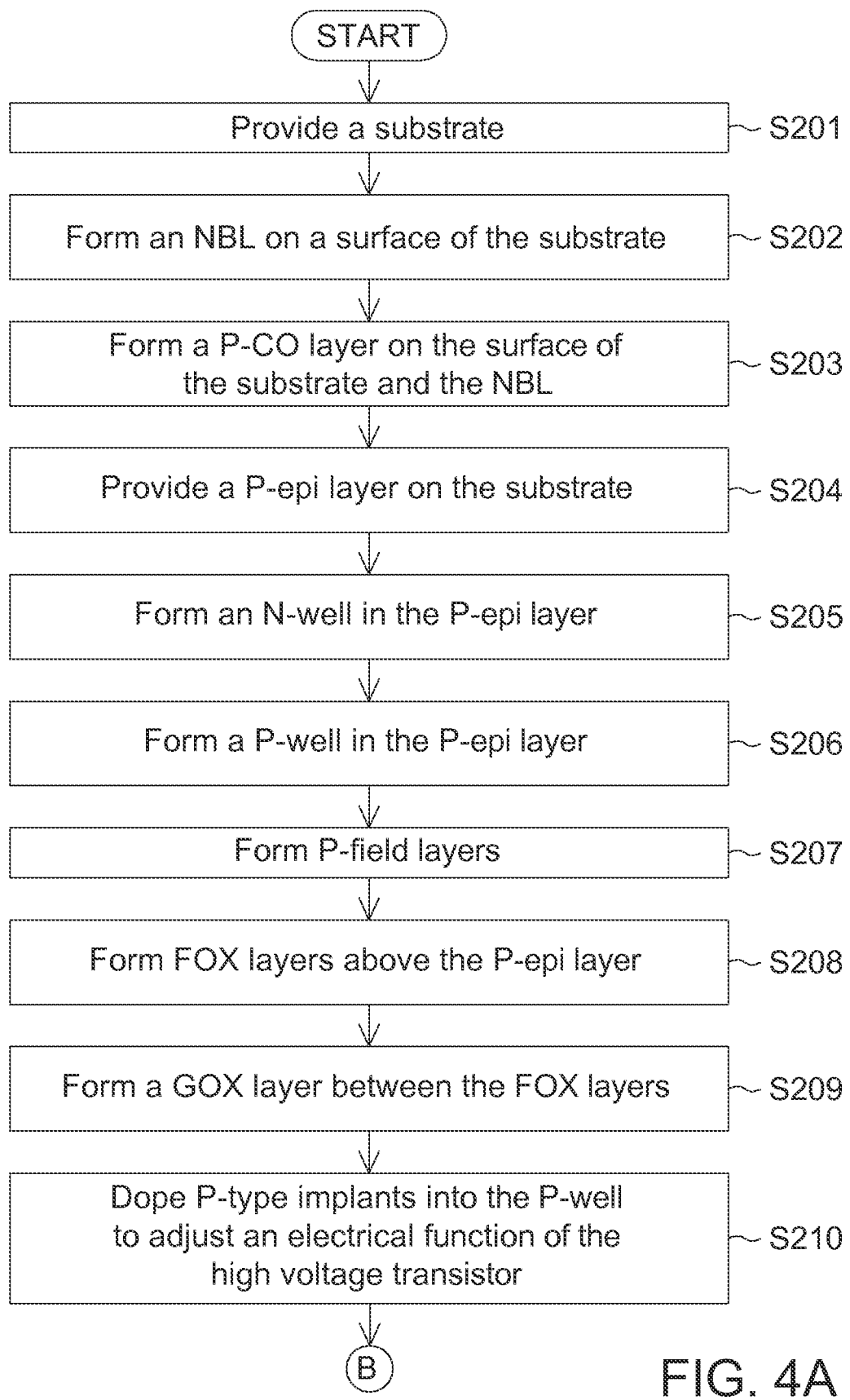
FIGS. 4A and 4B are flow charts showing a manufacturing method for a P-type high voltage transistor according to a second embodiment of the invention.
Figure 4B:
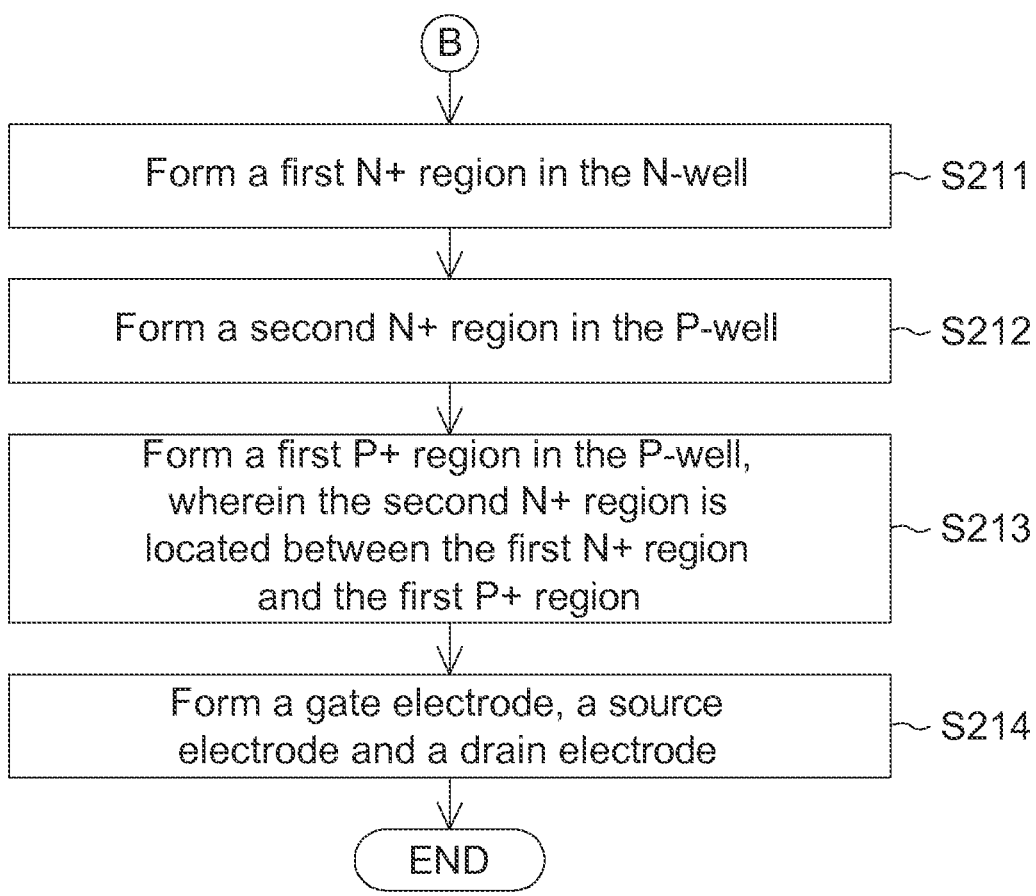
Figure 5A:
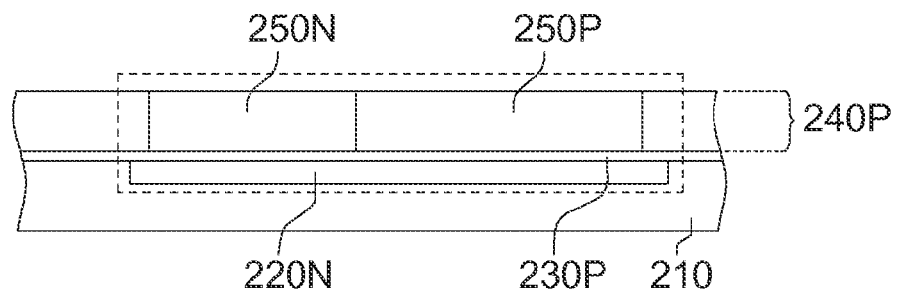
FIGS. 5A to 5C are schematic illustrations showing structures in various steps of FIGS. 4A and 4B.
Figure 5B:
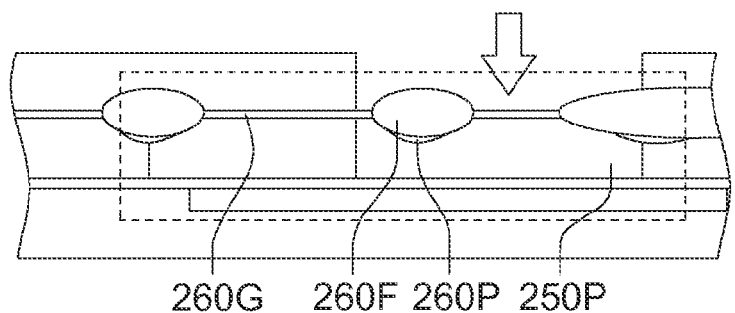
Figure 5C:
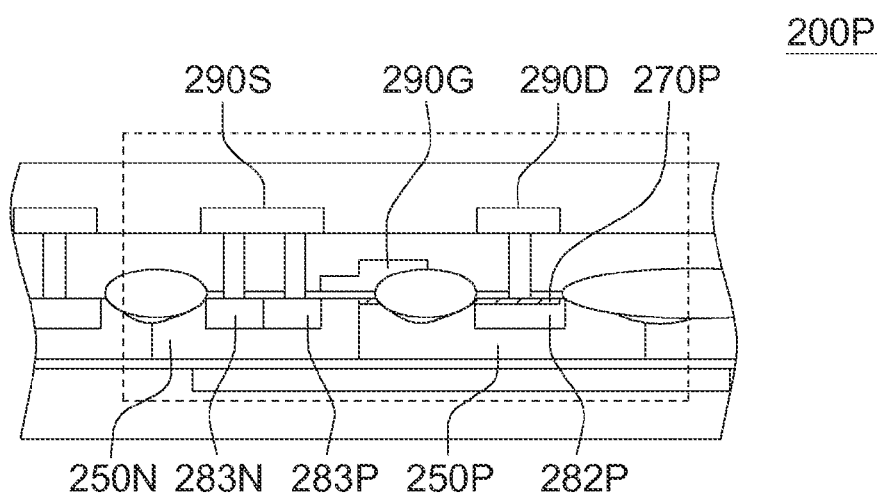

Please refer to FIGS. 4A and 4B and FIGS. 5A to 5C. FIGS. 4A and 4B are flow charts showing a manufacturing method for a P-type high voltage transistor 200P according to the second embodiment of the invention. FIGS. 5A to 5C are schematic illustrations showing structures in various steps of FIGS. 4A and 4B. Similarities between the manufacturing method for the P-type high voltage transistor 200P of the second embodiment and the manufacturing method for the N-type high voltage transistor 100N of the first embodiment will be omitted.

First, after steps S201 to S209 are performed, as shown in FIGS. 5A and 5B, a substrate 210, an N-buried layer (NBL) 220N, a P-CO layer 230P, a P-epi layer 240P, a P-well 250P, an N-well 250N, a P-field layer 260P, a plurality of FOX layers 260F, a GOX layer 260G and the like are formed.

Then, in step S210, as shown in FIG. 5B, P-type implants 270P are doped into the P-well 250P to adjust the electrical function of the high voltage transistor 200P. In this step, a specific mask is adopted to perform the exposure development process to form a patterned resist layer, and then the process of doping the P-type implants 270P is performed. In one embodiment, the same mask may be adopted in the step S210 of doping the P-type implants 270P into the P-well 250P and the step S206 of forming the P-well 250P. Consequently, no extra expensive mask cost has to be added, and the manufacturing cost is greatly decreased.

In addition, the step S210 of doping the P-type implants 270P into the P-well 250P is performed after the step S208 of forming the FOX layers 260F and the step S209 of forming the GOX layer 260G. Consequently, it is possible to prevent the thermal processes performed in the step S208 of forming the FOX layers 260F and the step S209 of forming the GOX layer 260G from affecting the doping result of the P-type implants 270P.

In this embodiment, this step may also alternatively adopt the method of doping the N-type implants (not shown) into the N-well 250N to adjust the electrical function of the high voltage transistor 200P.

Next, in step S211, as shown in FIG. 5C, a second P+ region 282P is formed in the P-well 250P.

Then, in step S212, as shown in FIG. 5C, a third P+ region 283P is formed in the N-well 250N.

Next, in step S213, as shown in FIG. 5C, a third N+ region 283N is formed in the N-well 250N, wherein the third P+ region 283P is located between the second P+ region 282P and the third N+ region 283N.

Then, in step S214, as shown in FIG. 5C, a gate electrode 290G, a source electrode 290S and a drain electrode 290D are formed. The gate electrode 290G is located between the source electrode 290S and the drain electrode 290D. The source electrode 290S is electrically connected to the third N+ region 283N and the third P+ region 283P, and the drain electrode 290D is electrically connected to the third N+ region 283N.

Figure 6:
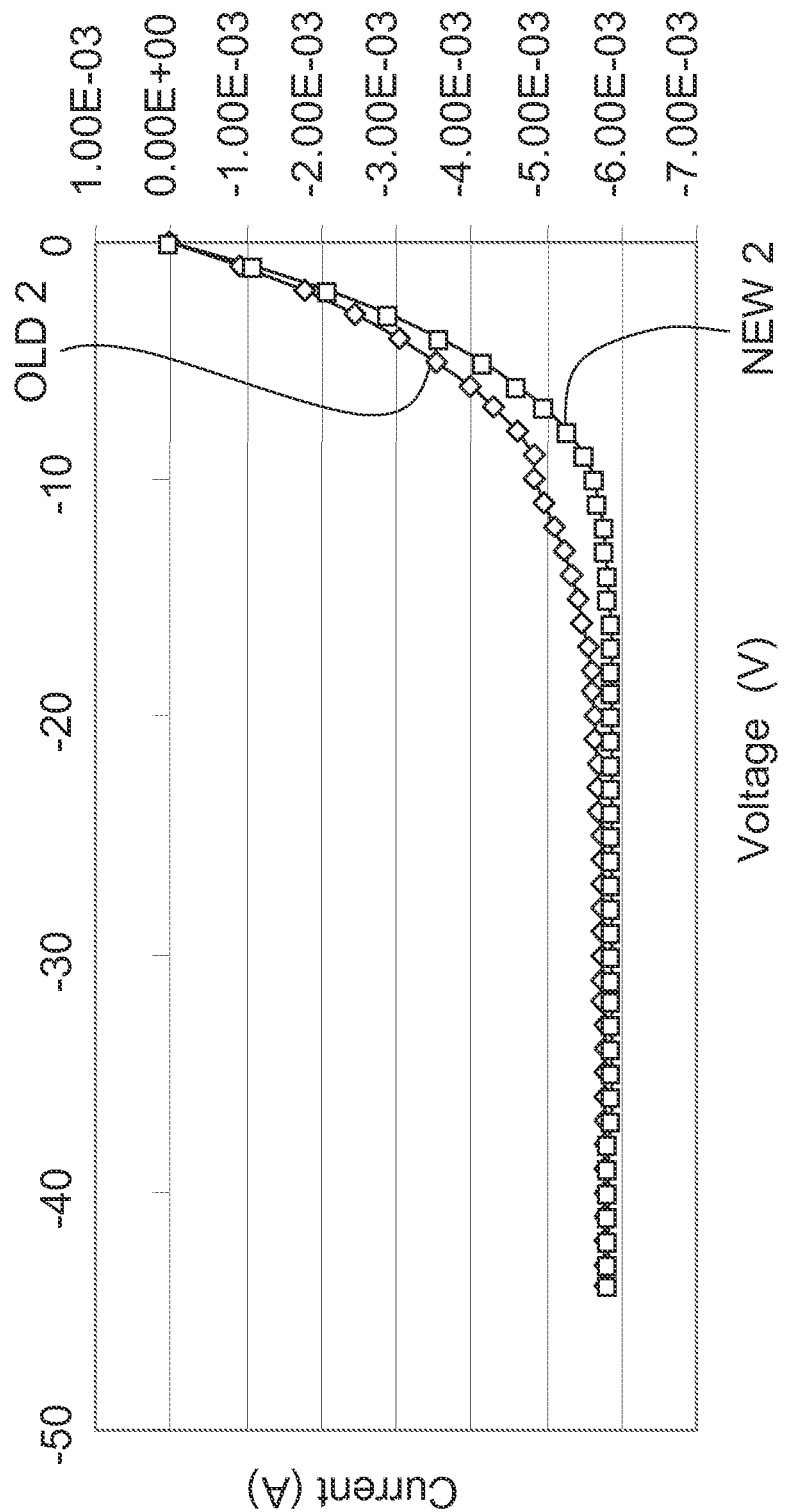
FIG. 6 is a plot showing a specific turn-on resistance of the P-type high voltage transistor according to the second embodiment of the invention.

Consequently, the P-type high voltage transistor 200P of this embodiment is completed. In the P-type high voltage transistor 200P of this embodiment, the step S210 of doping the P-type implants 270P into the P-well 250P is arranged after the step S208 of forming the FOX layers 260F and the step S209 of forming the GOX layer 260G, so that the doping result of the P-type implants 270P can be kept stable. FIG. 6 is a plot showing a specific turn-on resistance (Ronsp) of the P-type high voltage transistor according to the second embodiment of the invention. As shown on the left side of FIG. 6, it is found that the plot NEW2 of this embodiment is improved as compared with the conventional plot OLD2 in the unstable phenomena of the substrate current (Isub) and the specific turn-on resistance (Ronsp).

In addition, because the same mask is adopted in the step S210 of doping the P-type implants 270P into the P-well 250P and the step S206 of forming the P-well 250P, no extra expensive mask cost has to be added, and the manufacturing cost is greatly decreased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method for a high voltage transistor, the method comprising the steps of:
   providing a substrate;
   providing a P-type epitaxial (P-epi) layer above the substrate;
   forming an N-well in the P-epi layer;
   forming a P-well in the P-epi layer;
   forming a plurality of field oxide (FOX) layers above the P-epi layer, wherein a flat surface of the N-well is exposed by one of the FOX layers;
   forming a gate oxide (GOX) layer between the FOX layers;
   doping N-type implants into the N-well to adjust an electrical function of the high voltage transistor, wherein the N-type implants are disposed at whole of the flat surface of the N-well; and
   forming a first N+ region embedded in the N-well.

2. The method according to claim 1, wherein the step of doping the N-type implants into the N-well is performed after the step of forming the FOX layers.

3. The method according to claim 1, wherein the step of doping the N-type implants into the N-well is performed after the step of forming the GOX layer.

4. The method according to claim 1, wherein a mask is adopted in the step of doping the N-type implants into the N-well and the same mask is adopted in the step of forming the N-well.

5. The method according to claim 1, further comprising, before the step of providing the P-epi layer, the step of:
   forming an N-buried layer (NBL) on a surface of the substrate, the N-buried layer being located at a predetermined position of the P-well.

6. The method according to claim 5, further comprising, after the step of forming the N-buried layer, the step of:
   forming a P-type co-implanted layer above the surface of the substrate and the N-buried layer.

7. The method according to claim 1, further comprising, before the step of forming the FOX layers, the step of:
   forming a plurality of P-field layers at predetermined positions where the FOX layers are to be formed.

8. The method according to claim 1, further comprising the steps of:
   forming a second N+ region embedded in the P-well; and
   forming a first P+ region embedded in the P-well, the second N+ region being located between the first N+ region and the first P+ region.

9. The method according to claim 1, further comprising the steps of:
   forming a second P+ region embedded in the P-well; and
   forming a third P+ region embedded in the N-well, the third P+ region being located between the second P+ region and the first N+ region.

* * * * *